United States Patent
Kim et al.

(10) Patent No.: US 10,720,943 B2
(45) Date of Patent: Jul. 21, 2020

(54) DATA STORAGE DEVICE, OPERATION METHOD THEREOF AND STORAGE SYSTEM HAVING THE SAME

(71) Applicant: SK hynix Inc., Gyeonggi-do (KR)

(72) Inventors: Jung Ae Kim, Gyeonggi-do (KR); Jang Hyun Kim, Gyeonggi-do (KR); Sung Jin Park, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/216,141

(22) Filed: Dec. 11, 2018

(65) Prior Publication Data
US 2020/0036391 A1    Jan. 30, 2020

(30) Foreign Application Priority Data
Jul. 25, 2018  (KR) .......... 10-2018-0086363

(51) Int. Cl.
| | | |
|---|---|---|
| *H03M 13/11* | (2006.01) | |
| *H03M 13/00* | (2006.01) | |
| *G06F 8/65* | (2018.01) | |
| *G06F 11/10* | (2006.01) | |
| *H04L 1/00* | (2006.01) | |

(52) U.S. Cl.
CPC ............ *H03M 13/116* (2013.01); *G06F 8/65* (2013.01); *G06F 11/1004* (2013.01); *H03M 13/616* (2013.01); *H03M 13/635* (2013.01); *H04L 1/0061* (2013.01)

(58) Field of Classification Search
CPC ............ H03M 13/116; H03M 13/616; H03M 13/635; G06F 8/65; G06F 11/1004; H04L 1/0061
See application file for complete search history.

(56) References Cited

U.S. PATENT DOCUMENTS

| | | | |
|---|---|---|---|
| 2008/0028273 A1* | 1/2008 | Jeong .................. | H03M 13/116 714/752 |
| 2018/0019765 A1* | 1/2018 | Hsiao .................. | G06F 11/1068 |
| 2018/0034476 A1* | 2/2018 | Kayser ............. | H03M 13/6393 |
| 2018/0088963 A1* | 3/2018 | Arora .................... | G06F 9/4406 |

FOREIGN PATENT DOCUMENTS

KR          101244779          3/2013

* cited by examiner

*Primary Examiner* — April Y Blair
*Assistant Examiner* — Sazzad Hossain
(74) *Attorney, Agent, or Firm* — IP & T Group LLP

(57) ABSTRACT

A data storage device may include: a storage configured to store user data, firmware and a boot code; and a controller configured to control data exchange with the storage, and comprising an error correction code (ECC) engine configured to perform error correction during the data exchange, wherein the ECC engine stores a first parity check matrix, performs error correction on data exchanged with the storage based on the first parity check matrix during a first operation mode, and performs error correction on data exchanged with the storage based on a second parity check matrix extracted from the firmware during a second operation mode.

18 Claims, 7 Drawing Sheets

DATA STORAGE DEVICE, OPERATION METHOD THEREOF AND STORAGE SYSTEM HAVING THE SAME

CROSS-REFERENCE TO RELATED APPLICATION

The present application claims priority under 35 U.S.C. § 119(a) to Korean application number 10-2018-0086363, filed on Jul. 25, 2018, in the Korean Intellectual Property Office, which is incorporated herein by reference in its entirety.

BACKGROUND

1. Technical Field

Various embodiments generally relate to a semiconductor integrated device, and more particularly, to a data storage device, an operation method thereof and a storage system including the same.

2. Related Art

A storage device is coupled to a host device, and accesses data according to a request of the host device. Recently, with the rapid increase in use of portable electronic devices, more and more portable electronic devices employ a high-capacity storage medium in order to provide various functions based on multi-media data. Examples of the storage medium capable of satisfying such a demand may include a flash memory-based storage medium.

The flash memory-based storage medium has many advantages in that it has a high capacity, nonvolatile property, low unit price and small power consumption and provides a high-speed data processing speed.

The refinement of the flash memory fabrication technology and the spread of the multi-level cell (MLC) technology for storing multi-bit data in one cell have reduced the fabrication cost of storage media, but may degrade the reliability and durability of the storage media.

SUMMARY

In an embodiment, a data storage device may include: a storage configured to store user data, firmware and a boot code; and a controller configured to control data exchange with the storage, and comprising an error correction code (ECC) engine configured to perform error correction during the data exchange, wherein the ECC engine stores a first parity check matrix, performs error correction on data exchanged with the storage based on the first parity check matrix during a first operation mode, and performs error correction on data exchanged with the storage based on a second parity check matrix extracted from the firmware during a second operation mode.

In an embodiment, there is provided an operation method of a data storage device which includes a storage for storing user data, firmware and a boot code and a controller including an error correction code (ECC) engine for performing error correction during data exchange with the storage, the operation method comprising: operating, by the data storage device, in a first operation mode; extracting, by the ECC engine, a parity check matrix from the firmware as an operation mode of the data storage device is changed from the first operation mode to a second operation mode, the parity check matrix corresponding to a code rate to be used in the second operation mode; and performing, by the ECC engine, error correction on data exchanged with the storage using the parity check matrix extracted from the firmware.

In an embodiment, a storage system may include: a host device; and a data storage device comprising a storage configured to store user data, firmware and a boot code, and a controller configured to control data exchange with the storage, wherein the controller comprises an error correction code (ECC) engine which stores a first parity check matrix, performs error correction on data exchanged with the storage based on the first parity check matrix during a first operation mode, and performs error correction on data exchanged with the storage based on a second parity check matrix extracted from the firmware during a second operation mode.

In an embodiment, a data storage device may include: a storage configured to store a boot code and firmware; and a controller including an error correction code (ECC) engine, wherein the ECC engine is configured to: perform an error correction operation on user data, which is to be written to, or read from, the storage, based on a first matrix corresponding to a default code rate, and perform an error correction operation on system data to update the boot code, when update of the boot code is to be performed, based on a second matrix extracted from the firmware, the second matrix corresponding to a code rate different from the default code rate.

DETAILED DESCRIPTION

A data storage device, an operation method thereof and a storage system including the same according to the present disclosure will be described below with reference to the accompanying drawings through embodiments.

Figure 1:
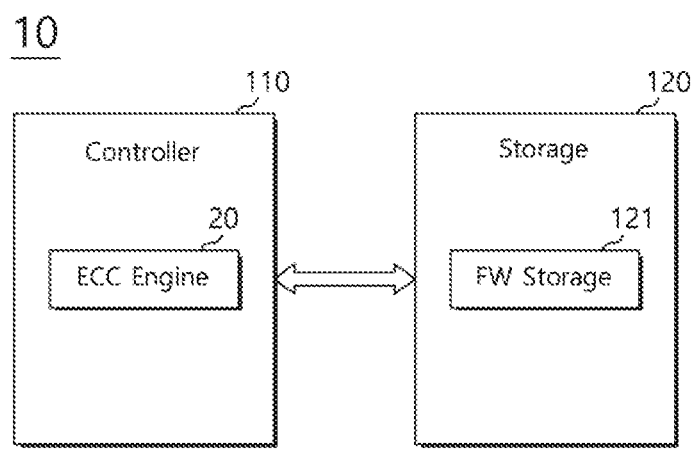
FIG. 1 is a diagram illustrating a data storage device in accordance with an embodiment.

FIG. 1 is a diagram illustrating a data storage device 10 in accordance with an embodiment.

Referring to FIG. 1, the data storage device 10 may include a controller 110 and a storage 120. Although not illustrated, a buffer memory may be disposed within, or externally to, the controller 110.

The controller 110 may control the storage 120 in response to a request of a host device (not shown). For example, when a program (or write) command, an access address and data are provided from the host device, the controller 110 may write the data to the storage 120. Furthermore, the controller 110 may read data from the storage 120 and provide the read data to the host device in response to a read command and access address of the host device.

In an embodiment, the controller 110 may include an error correction code or error check and correction (ECC) engine 20.

The ECC engine 20 may be configured to detect an error of the data read from the storage 120. When the detected error falls within a correctable range, the ECC engine 20 may correct the detected error. The ECC engine 20 may include a circuit, system or device for error correction.

In an embodiment, the ECC engine 20 may generate data with parity bit by encoding data to store in the storage 120. The parity bit as well as the data to be written may be stored in the storage 120. The ECC engine 20 may correct an error bit of data read from the storage 120 using a parity check matrix. The parity check matrix may be differently set depending on the code rate of an ECC code used in the ECC engine 20.

The ECC engine 20 may perform error correction using coded modulation such as a low density parity check (LDPC) code, Bose, Chaudhuri, and Hocquenghem (BCH) code, turbo code, Reed-Solomon (RS) code, convolution code, recursive systematic code (RSC), trellis-coded modulation (TCM) or block coded modulation (BCM). However, the present invention is not limited to any particular code; any suitable code may be used for performing error correction.

Recently, much attention has been paid to an encoding method using the LDPC code.

The LDPC code is an error correction code which is the closest to the Shannon limit at an additive white Gaussian noise (AWGN) channel. The LDPC code provides asymptotically better performance than the turbo code, and enables parallelizable decoding.

In particular, the LDPC code is a linear block code which has low density because most elements of a parity check matrix H are '0'.

Figure 2A:
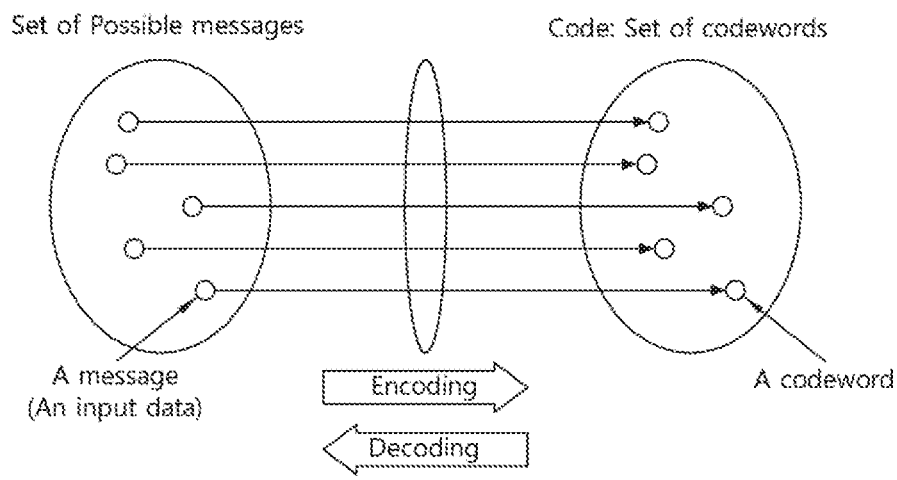
FIGS. 2A to 2C illustrate an operation of an error correction code (ECC) engine in accordance with an embodiment.
Figure 2B:
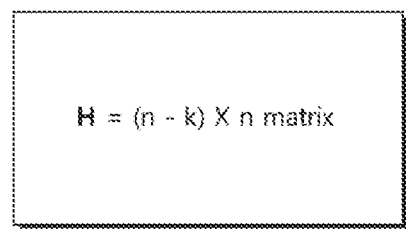
Figure 2C:
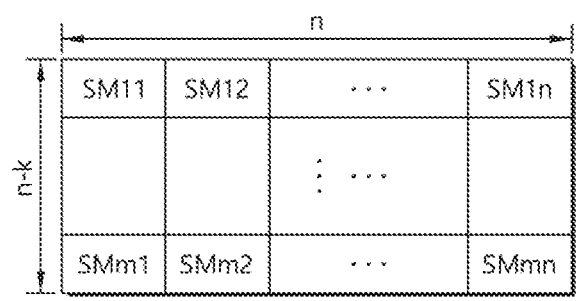

FIGS. 2A to 2C illustrate an operation of an error correction code (ECC) engine, e.g., ECC engine 20 of FIG. 1, in accordance with an embodiment.

FIG. 2A illustrates the encoding and decoding operations of the ECC engine 20.

Referring to FIG. 2A, when messages to be encoded (i.e., input data or source data) are received and a code rate is decided, the ECC engine 20 may encode the input data using the parity check matrix H depending on the decided code rate. Therefore, the respective input data may be encoded into codewords by the parity check matrix H. During decoding, the ECC engine 20 can restore the original messages by decoding the codewords using the parity check matrix H used for the encoding operation.

FIG. 2B illustrates the parity check matrix H. FIG. 2C illustrates the parity check matrix H including the plurality of sub matrixes.

Referring to FIGS. 2B and 2C, the code rate r may indicate the ratio of the length k of the input data to the length of the encoded data, i.e. the length n of the codewords (i.e., r=k/n). The parity check matrix H may include a diagonal matrix having a size of [n×(n−k)].

The parity check matrix H may include a plurality of sub matrixes SM11 to SMmn having a set dimension. The size of the parity check matrix H and elements of the sub matrixes may be decided according to the code rate r.

In an embodiment, the parity check matrix H may include (m×n) sub matrixes.

Since the parity check matrix has a considerably large size (for example, $10^5$ bits or more), the elements of the parity check matrix H may be expressed as the sub matrixes (or sub blocks) having a set size, in order to reduce the size of a memory required for storing the parity check matrix H.

Referring again to FIG. 1, the storage 120 may write data or output written data according to control of the controller 110. In an embodiment, the storage 120 may be configured as a volatile or nonvolatile memory device. In an embodiment, the storage 120 may be implemented with a memory device selected from various nonvolatile memory devices such as an electrically erasable and programmable read only memory (ROM) (EEPROM), NAND flash memory, NOR flash memory, phase-change random access memory (RAM) (PRAM), resistive RAM (ReRAM), ferroelectric RAM (FRAM) and spin torque transfer magnetic RAM (STT-MRAM). The storage 120 may include a plurality of dies, a plurality of chips or a plurality of packages. Furthermore, the storage 120 may include single-level cells each configured to store one-bit data or multi-level cells each configured to store multi-bit data.

In an embodiment, the storage 120 may include a firmware (FW) storage 121. The firmware storage 121 may store various pieces of firmware required for actuating and operating the data storage device 10. For example, the firmware storage 121 may store storage medium firmware, a boot code and the like.

The storage medium firmware may indicate firmware through which the controller 110 operates the data storage device 10 by controlling hardware constituting the storage 120. Therefore, the controller 110 may control a data input and output (I/O) operation on the storage 120 by driving the firmware stored in the firmware storage 121, and perform various operations for managing the storage 120, for example, garbage collection, address mapping, wear-leveling and the like.

The boot code may indicate a code for booting the data storage device 10.

In an embodiment, the data storage device 10 may have a booting procedure of finding a program to start the data storage device 10 and loading the program into a memory within the controller 110, such that an operating system (OS) is initialized to have control of the data storage device 10. The boot code may be referred to as a boot loader or bootstrap code. After the initialization of the data storage device 10, the boot code may be copied into the controller 110 from the storage 120 and then executed.

The storage medium firmware may be simply referred to as "firmware", and understood as a component that is distinguished from "boot code".

When an error that occurred in the boot code or the booting performance is to be corrected through the boot code, the boot code may be recovered or updated.

The data storage device 10 may operate in various operation modes. For example, the operation modes may include a user data processing mode and a system data processing mode. The code rate of a code used in the ECC engine 20 (hereinafter referred to as "ECC code") may be differently set for each of the operation modes. Since the parity check matrix is differently set depending on the code rate of the ECC code, the parity check matrix needs to be varied according to the code rate of the ECC code, which is set for each of the operation modes of the data storage device 10.

In an embodiment, the data storage device 10 may have a first operation mode for processing user data and a second operation mode for updating system data such as the boot code.

The first operation mode may include a normal operation mode or main operation mode. In the main operation mode, the data storage device 10 stores user data provided from the host device into the storage 120, and reads user data from the storage 120 and provides the read user data to the host device. The second operation mode may include a special operation mode for changing the boot code stored in the storage 120, when the boot code needs to be changed (recovered or upgraded).

The code rate of the ECC engine 20 for processing the first operation mode may be different from the code rate of the ECC engine 20 for processing the second operation mode. As described above, the parity check matrix H may be differently set depending on the code rate, and have a considerably large size.

In an embodiment, the parity check matrix for the main operation of the data storage device 10 may be mounted in the ECC engine 20 or the controller 110. Furthermore, parity check matrixes for operation modes other than the main operation mode (i.e., first operation mode) may be matched with the corresponding code rates, included in a firmware binary file, and stored in the storage 120. The firmware binary file may be generated through a process of converting a program source file into an executable machine language file and then extracting binary information composed of only machine language codes from the executable machine language file.

From another point of view, the ECC engine 20 or the controller 110 may store the parity check matrix depending on the code rate required for performing the first operation mode. The storage 120 may store the firmware. In particular, the firmware may be configured to include the parity check matrix depending on the code rate required for performing the operation mode excluding the first operation mode, for example, the second operation mode.

In an embodiment, the parity check matrix depending on the code rate required for the operation mode of the ECC engine 20 for processing system data may be generated in a machine language format, included in the firmware, and stored in the storage 120.

When the code rate of the ECC engine 20 is changed according to the operation mode of the data storage device 10, the parity check matrix corresponding to the changed code rate may be extracted and used for an ECC operation.

In an embodiment, a specific region having a preset capacity within the storage 120 may be assigned to the firmware storage 121, and a user may not be allowed to access the region assigned to the firmware storage 121, such that the firmware or the boot code may be protected so as not to be falsified or modified.

In an embodiment, the firmware stored in the firmware storage 121 may be frequently updated in order to correct an error, improve the performance of the data storage device 10, or add a function.

The boot code stored in the specific region within the storage 120 may also be updated for error correction or performance improvement. When the boot code is updated, a parity check matrix depending on a preset code rate may be used. The parity check matrix for the update operation may be generated so as to be included in the firmware. The parity check matrix within the firmware may also be changed or added. Since the change or addition of the firmware may be performed through the update of the firmware, the reliability of the ECC operation may be guaranteed.

Figure 3:
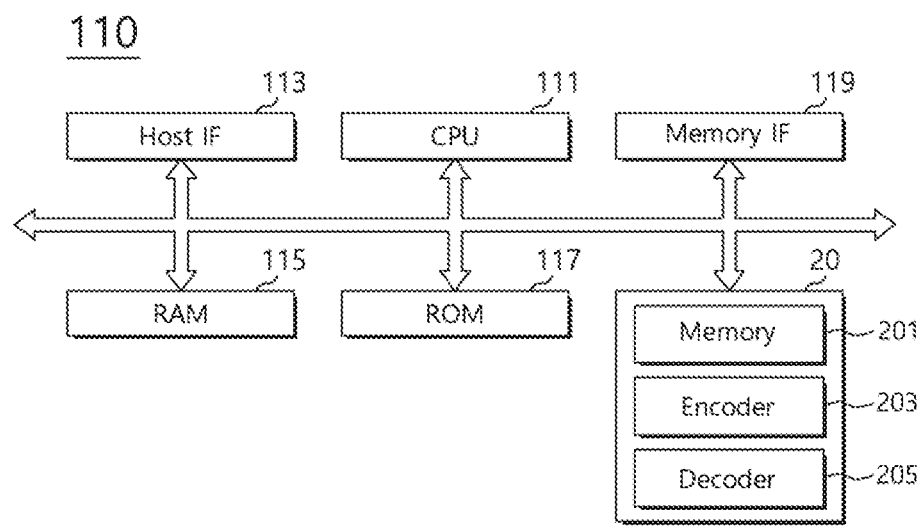
FIG. 3 is a diagram illustrating a controller in accordance with an embodiment.

FIG. 3 is a diagram illustrating a controller, e.g., controller 110 of FIG. 1, in accordance with an embodiment.

Referring to FIG. 3, the controller 110 may include a central processing unit (CPU) 111, a host interface (IF) 113, a random access memory (RAM) 115, a read only memory (ROM) 117, a memory interface (IF) 119 and the ECC engine 20.

The CPU 111 may read the firmware stored in the firmware storage 121, and drive the read firmware. The firmware driven by the CPU 111 may process a request of the host device, and control overall operations of the storage 120. In an embodiment, the CPU 111 may be configured to transfer various pieces of control information to the host IF 113, the RAM 115 and the memory IF 119, the various pieces of control information being required for reading or writing data from or to the storage 120. In an embodiment, the CPU 111 may execute the function of a flash translation layer (FLT) for performing garbage collection, address mapping, wear-leveling or error detection and correction to manage the storage 120.

The host IF 113 may receive a command and clock signal from the host device (or host processor), and provide a communication channel for controlling data input/output, according to control of the CPU 111. In particular, the host IF 113 may provide a physical connection between the host device and the data storage device 10. Furthermore, the host IF 113 may provide an interface with the data storage device 10 in response to the bus format of the host device. The bus format of the host device may include one or more of standard interface protocols such as secure digital (SD), universal serial bus (USB), multi-media card (MMC), embedded MMC (eMMC), personal computer memory card international association (PCMCIA), parallel advanced technology attachment (PATA), serial advanced technology attachment (PATA), small computer system interface (SCSI), serial attached SCSI (SAS), peripheral component interconnection (PCI), PCI Express (PCI-e or PCIe) and universal flash storage (UFS).

The RAM 115 may store program codes such as the firmware read from the storage 120 and code data used by the program codes. The RAM 115 may serve as a working memory of the controller 110.

The RAM 115 may be replaced with a non-transitory machine-readable medium capable of storing the program codes, such as a storage-class memory (SCM), non-volatile memory (NVM), flash memory or solid state drive (SSD).

The ROM 117 may store a program code or ROM code for controlling the data storage device 10 to copy the boot code into the RAM 115, when the data storage device 10 is activated. According to the ROM code, the boot code stored in the storage 120 may be copied into the controller 110 and then executed.

The memory IF 119 may provide a communication channel for transmitting and receiving signals between the controller 110 and the storage 120. The memory IF 119 may write data to the storage 120 according to control of the CPU 111. The data may be temporarily stored in a buffer memory. Furthermore, the memory IF 119 may transfer data read from the storage 120 to the buffer memory to temporarily store the data.

The ECC engine 20 may include a memory 201, an encoder 203 and a decoder 205.

In an embodiment, the memory 201 may store the parity check matrix corresponding to the code rate used for the normal operation mode or main operation mode of the data storage device 10. Therefore, in the first operation mode for processing user data, the ECC engine 20 may perform an ECC operation using the parity check matrix stored in the memory 201.

The encoder 203 may be configured to generate data with a parity bit by performing error correction encoding on data which are transferred so as to be written to the storage 120, and write the generated data to the storage 120.

The decoder 205 may be configured to correct an error of data read from the storage 120 using the parity check matrix depending on the preset code rate.

In an embodiment, during the first operation mode (i.e., normal or main operation mode) for reading and writing user data, the decoder 205 may correct an error bit using a first parity check matrix corresponding to a first code rate.

When an error occurred in the boot code or during the second operation mode (i.e., special operation mode) for recovering or updating the boot code to improve the booting performance, the boot code may be read or written at a code rate different from the first operation mode. The code rate used in the second operation mode may be synchronized with the code rate of the ROM code for controlling the data storage device 10 to copy the boot code. Therefore, when the data storage device 10 is operated in the second operation mode, a required parity check matrix may be extracted from the firmware and then used. In other words, during the second operation mode for processing system data, the parity check matrix included in the firmware stored in the firmware storage 121 may be used to perform the ECC operation.

Figure 4:
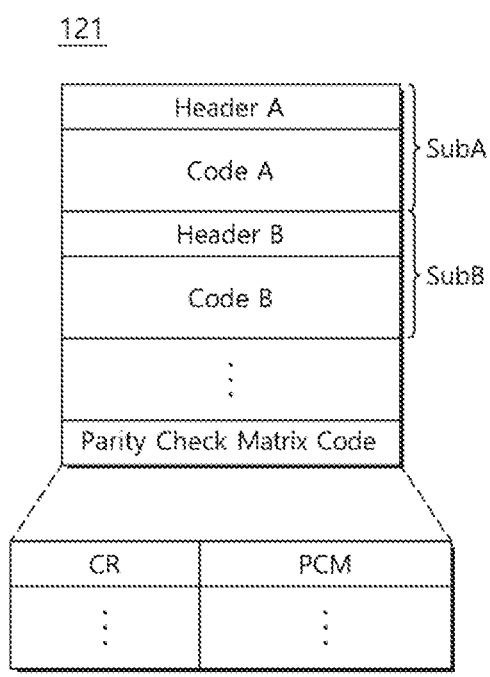
FIG. 4 illustrates firmware stored in a firmware storage in accordance with an embodiment.

FIG. 4 illustrates firmware stored in a firmware storage, e.g., firmware storage 121 of FIG. 1, in accordance with an embodiment.

Referring to FIG. 4, the firmware may include a group of sub programs including Sub A and Sub B.

Each of the sub programs Sub A and Sub B may include a header part and a code part. The header part may include processor information and the start position, offset, size and link information of the corresponding sub program code. The code part may include an executable code recorded therein.

The parity check matrix set for each code rate may be encoded and included in a designated region of the firmware, for example, the rear end of the firmware. The designated region may store code rates CRs, and the parity check matrix PCM for each code rate CR.

The firmware stored in the firmware storage 121 may be updated in order to correct an error of the firmware, improve the performance of the data storage device 10, or add a function. Furthermore, when the parity check matrix needs to be added or changed, the firmware may be updated.

Figure 5:
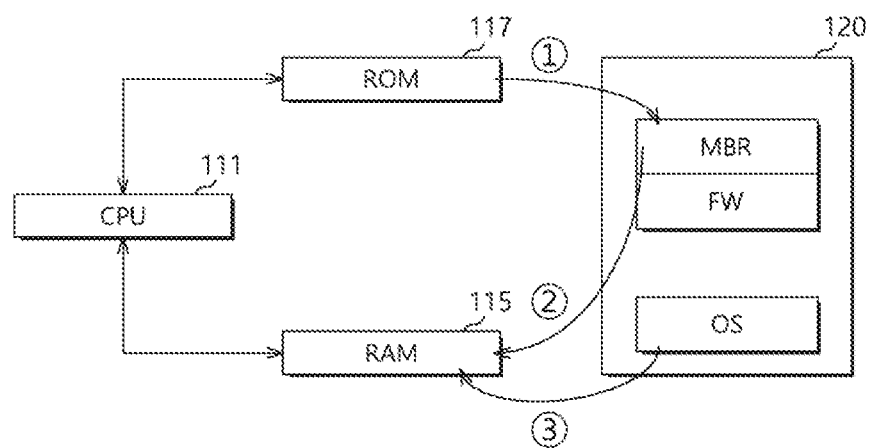
FIG. 5 illustrates a booting procedure in accordance with an embodiment.

FIG. 5 illustrates a booting procedure in accordance with an embodiment.

Referring to FIG. 5, the booting procedure may be performed by the controller 110 including a CPU 111, a RAM 115 and a ROM 117, as shown in FIG. 3. When power is supplied to the data storage device 10, the ROM code within the ROM 117 may be first executed. The ROM code may execute a command ① to access a specific region of the storage 120 and copy the boot code stored in the that region into the RAM 115.

In an embodiment, the boot code may be stored in a fixed region of the storage 120, for example, a boot block serving as a master boot region MBR.

When the boot code is copied into the RAM 115 from the boot block (②), the boot code may be executed by the CPU 111.

As the boot code is executed, the program code of an operating system (OS) stored in the storage 120 may be copied into the RAM 115 (③), and executed by the CPU 111. Therefore, the data storage device 10 may be controlled by the OS.

When the boot code stored in the storage 120 is updated, a parity check matrix stored in the firmware may be extracted in order to perform error correction through a parity check matrix corresponding to a code rate used for inputting/outputting the boot code.

Figure 6:
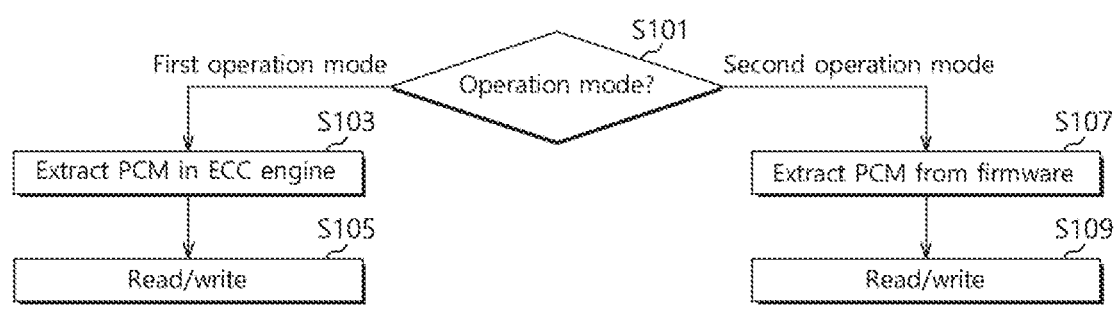
FIG. 6 is a flowchart illustrating an operation method of a data storage device in accordance with an embodiment.

FIG. 6 is a flowchart illustrating an operation method of a data storage device, e.g., data storage device 10 of FIGS. 1 and 3, in accordance with an embodiment.

Referring to FIG. 6, at step S101, the data storage device 10 may determine the current operation mode to process data.

When it is determined that the current operation mode is the first operation mode for performing error correction at the first code rate, the ECC engine 20 may extract the parity check matrix PCM corresponding to the first code rate from the memory 201 within the ECC engine 20 at step S103. The ECC engine 20 may correct an error in a read and/or write operation using the extracted parity check matrix at step S105.

In an embodiment, the first operation mode may include the normal operation mode for reading or writing user data.

When it is determined at step S101 that the current operation mode is the second operation mode for performing error correction at the second code rate, the ECC engine 20 may extract the parity check matrix PCM corresponding to the second code rate from the firmware within the firmware storage 121 at step S107. The ECC engine 20 may correct an error in a read and/or write operation using the extracted parity check matrix at step S109.

In an embodiment, the second operation mode may include a special operation mode for processing system data. For example, the processing of the system data may include recovering or updating the boot code in order to correct an error of the boot code or improve the performance.

Since the capacity of the memory 201 in the ECC engine 20 is limited, all of the parity check matrixes corresponding to the respective code rates cannot be mounted in the ECC engine 20.

In an embodiment, however, the parity check matrix for each of the code rates may be included in the firmware and retained in the storage 120. Therefore, various parity check matrixes may be stored and provided regardless of the capacity of the memory 201 in the ECC engine 20. When the code rate is changed while the operation mode is changed, the parity check matrix corresponding to the changed code rate may be extracted and used for error correction.

Figure 7:
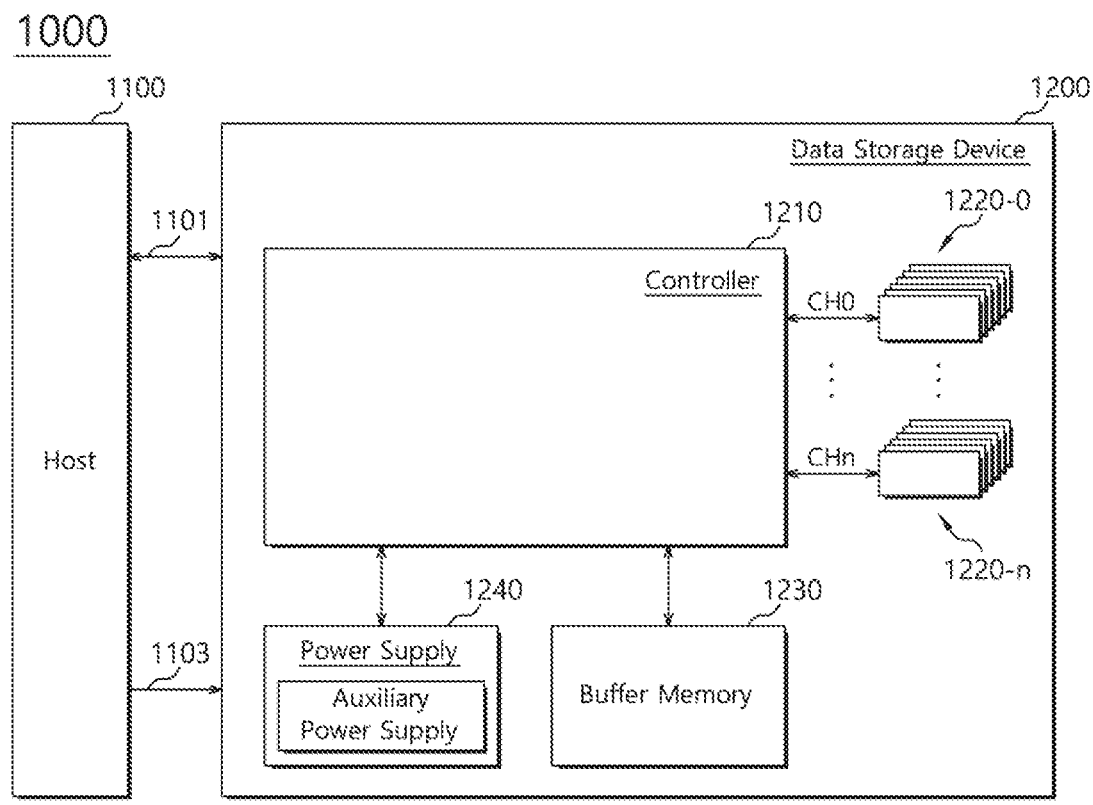
FIG. 7 is a diagram illustrating a data storage system in accordance with an embodiment.

FIG. 7 is a diagram illustrating a data storage system 1000 in accordance with an embodiment.

Referring to FIG. 7, the data storage 1000 may include a host device 1100 and the data storage device 1200. In an embodiment, the data storage device 1200 may be implemented as a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface, a control component, a random access memory used as a working memory, an error correction code (ECC) component, and a memory interface. In an embodiment, the controller 1210 may configured as controller 110 shown in FIG. 1 and FIG. 3.

The host device 1100 may exchange a signal with the data storage device 1200 through the signal connector 1101. The signal may include a command, an address, data, and the like.

The controller 1210 may analyze and process the signal received from the host device 1100. The controller 1210 may control operations of internal function blocks according to firmware or software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103, to the inside of the data storage device 1200. The power supply 1240 may include an auxiliary power supply. The auxiliary power supply may supply power to allow the data storage device 1200 to be properly terminated when a sudden power-off occurs. The auxiliary power supply may include large capacity capacitors.

The signal connector 1101 may be implemented by any of various types of connectors depending on an interface scheme between the host device 1100 and the data storage device 1200.

The power connector 1103 may be implemented by any of various types of connectors depending on a power supply scheme of the host device 1100.

Figure 8:
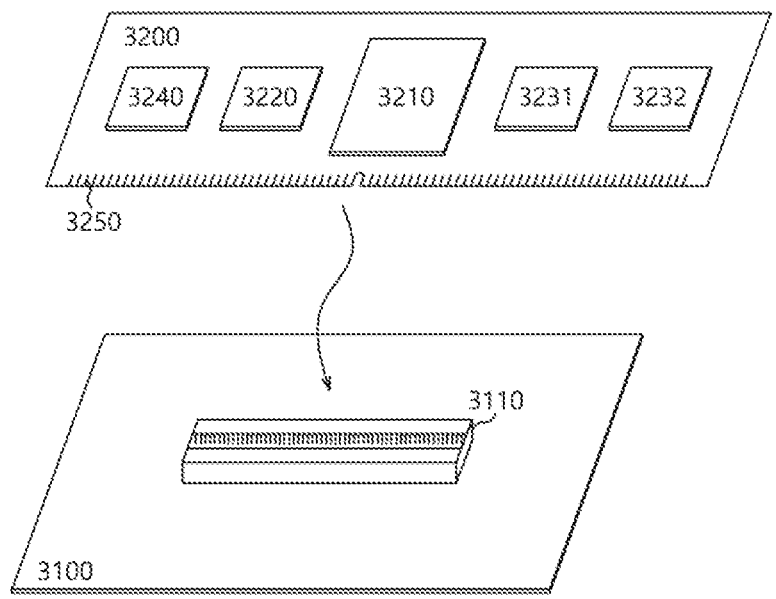
FIG. 8 and FIG. 9 are diagrams illustrating a data processing system in accordance with an embodiment.

FIG. 8 is a diagram illustrating a data processing system 3000 in accordance with an embodiment. Referring to FIG. 8, the data processing system 3000 may include a host device 3100 and a memory system 3200.

The host device 3100 may be implemented as a board such as a printed circuit board. Although not shown, the host device 3100 may include internal function blocks for performing the function of a host device.

The host device 3100 may include a connection terminal 3110 such as a socket, a slot or a connector. The memory system 3200 may be mounted to the connection terminal 3110.

The memory system 3200 may be implemented as a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 as shown in FIGS. 1 and 3.

The buffer memory device 3220 may temporarily store data to be stored in the nonvolatile memory devices 3231 and 3232. Further, the buffer memory device 3220 may temporarily store the data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250, to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data and the like and power may be transferred between the host device 3100 and the memory system 3200. The connection terminal 3250 may be implemented by any of various types of terminals depending on an interface scheme between the host device 3100 and the memory system 3200. The connection terminal 3250 may be disposed on any one side of the memory system 3200.

Figure 9:
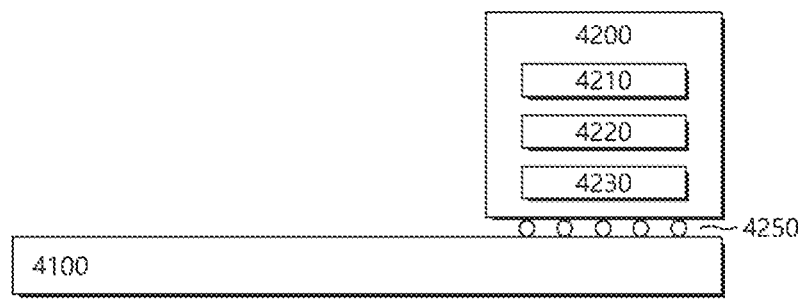

FIG. 9 is a diagram illustrating a data processing system 4000 in accordance with an embodiment. Referring to FIG. 9, the data processing system 4000 may include a host device 4100 and a memory system 4200.

The host device 4100 may be implemented as a board such as a printed circuit board. Although not shown, the host device 4100 may include internal function blocks for performing the function of the host device 4100.

The memory system 4200 may be implemented as a surface-mounting type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 as shown in FIGS. 1 and 3.

The buffer memory device 4220 may temporarily store data to be stored in the nonvolatile memory device 4230. Further, the buffer memory device 4220 may temporarily store the data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 10:
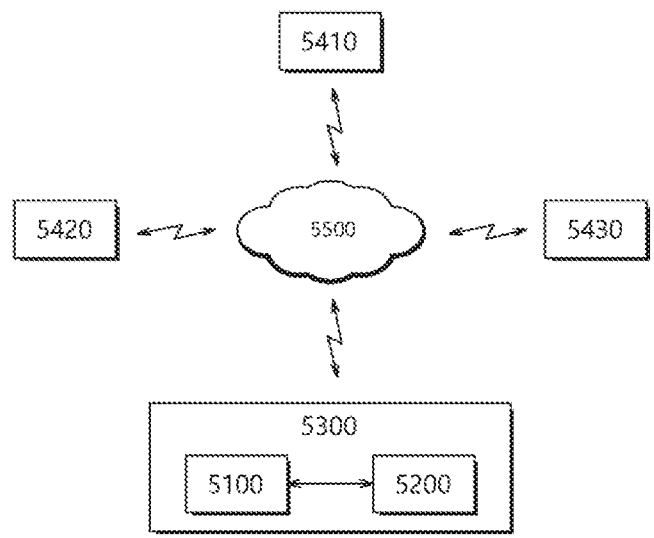
FIG. 10 is a diagram illustrating a network system including a data storage device in accordance with an embodiment.

FIG. 10 is a diagram illustrating a network system 5000 including a data storage device in accordance with an embodiment. Referring to FIG. 10, the network system 5000 may include a server system 5300 and a plurality of client systems 5410 to 5430 which are coupled through a network 5500.

The server system 5300 may service data in response to requests from the plurality of client systems 5410 to 5430. For example, the server system 5300 may store the data provided from the plurality of client systems 5410 to 5430.

For another example, the server system 5300 may provide data to the plurality of client systems 5410 to 5430.

The server system 5300 may include a host device 5100 and a memory system 5200. The memory system 5200 may be configured as the memory system 10 shown in FIG. 1, the data storage device 1200 shown in FIG. 7, the memory system 3200 shown in FIG. 8 or the memory system 4200 shown in FIG. 9.

Figure 11:
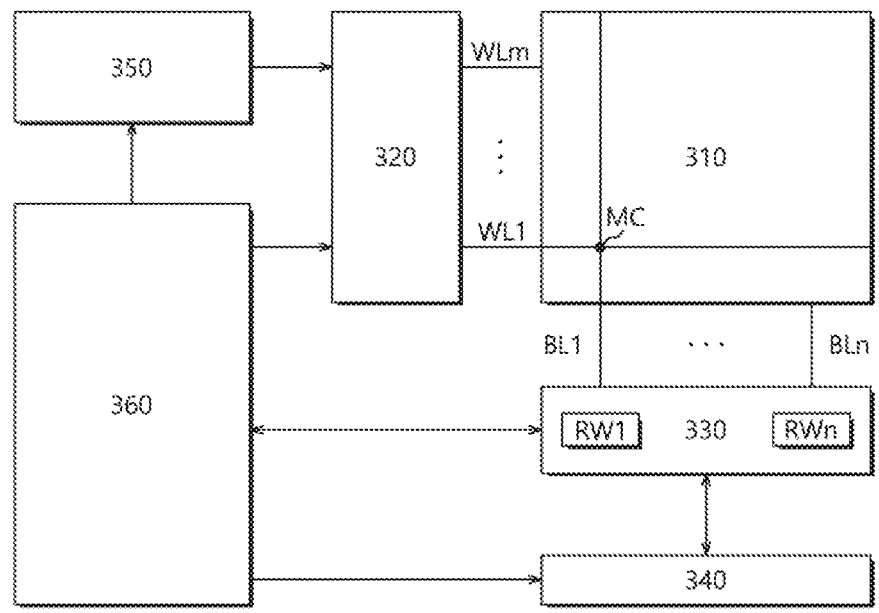
FIG. 11 is a block diagram illustrating a nonvolatile memory device included in a data storage device in accordance with an embodiment.

FIG. 11 is a block diagram illustrating a nonvolatile memory device 300 included in a data storage device in accordance with an embodiment. Referring to FIG. 11, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array has a direction perpendicular to the flat surface of a semiconductor substrate. Moreover, the three-dimensional memory array means a structure including NAND strings in which memory cells are disposed in a vertically stacked arrangement.

However, the structure of the three-dimensional memory array is not limited the above-identified arrangement. Rather, the memory array structure may be configured in a highly integrated manner both horizontally and vertically.

The row decoder 320 may be coupled with the memory cell array 310 through the word lines WL1 to WLm. The row decoder 320 may operate according to control of the control logic 360. The row decoder 320 may decode an address provided from an external device (e.g., controller 110 of FIG. 1). The row decoder 320 may select and drive the word lines WL1 to WLm based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, during a write operation, the data read/write block 330 may operate as a write driver which stores data provided from the external device, in the memory cell array 310. For another example, during a read operation, the data read/write block 330 may operate as a sense amplifier which reads out data from the memory cell array 310.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, during a program operation, a program voltage may be applied to a word line of memory cells for which the program operation is to be performed. For another example, during an erase operation, an erase voltage may be applied to a well area of memory cells for which the erase operation is to be performed. For still another example, during a read operation, a read voltage may be applied to a word line of memory cells for which the read operation is to be performed.

The control logic 360 may control general operations of the nonvolatile memory device 300 based on control signals provided from the external device. For example, the control logic 360 may control operations of the nonvolatile memory device 300 such as read, write and erase operations of the nonvolatile memory device 300.

While various embodiments have been described above, it will be understood to those skilled in the art in light of the present disclosure that the embodiments described are examples only. Accordingly, the data storage device, the operating method thereof and the storage system including the same described herein are not limited based on the described embodiments. Rather, the present invention encompasses all modifications and variations that fall within the scope of the claims.

What is claimed is:

1. A data storage device comprising:
   a non-volatile storage configured to store user data, firmware storing a second parity check matrix and a boot code; and
   a controller configured to control data exchange with the non-volatile storage, and comprising an error correction code (ECC) engine configured to perform error correction during the data exchange,
   wherein the ECC engine stores a first parity check matrix, performs error correction on data exchanged with the non-volatile storage based on the first parity check matrix during a first operation mode, and performs error correction on data exchanged with the non-volatile storage based on the second parity check matrix extracted from the firmware during a second operation mode, and
   wherein a code rate of the first parity check matrix and a code rate of the second parity check matrix are different.

2. The data storage device of claim 1, wherein the first operation mode comprises an input and output mode for user data.

3. The data storage device of claim 2, wherein the second operation mode is decided among operation modes excluding the first operation mode.

4. The data storage device of claim 1, wherein the second operation mode comprises an update mode for the boot code.

5. The data storage device of claim 1, wherein the firmware comprises a set of parity check matrix codes for respective code rates of an ECC code used in the ECC engine.

6. The data storage device of claim 5, wherein the non-volatile storage stores firmware which is updated as any of the parity check matrix codes is changed or another parity check matrix code is added.

7. An operation method of a data storage device which includes a non-volatile storage for storing user data, firmware storing a second parity check matrix and a boot code and a controller including an error correction code (ECC) engine storing a first parity check matrix for performing error correction during data exchange with the non-volatile storage, the operation method comprising:
   operating, by the data storage device, in a first operation mode;

performing, by the ECC engine, error correction on data exchanged with the non-volatile storage using the first parity check matrix extracted from the ECC engine;

extracting, by the ECC engine, the second parity check matrix from the firmware as an operation mode of the data storage device is changed from the first operation mode to a second operation mode; and performing, by the ECC engine, error correction on data exchanged with the non-volatile storage using the second parity check matrix extracted from the firmware, wherein a code rate of the first parity check matrix and a code rate of the second parity check matrix are different.

8. The operation method of claim 7, wherein the first operation mode comprises an input and output mode for user data.

9. The operation method of claim 8, wherein the second operation mode is decided among operation modes excluding the first operation mode.

10. The operation method of claim 7, wherein the second operation mode comprises an update mode for the boot code.

11. The operation method of claim 7, wherein the firmware comprises a set of parity check matrix codes for respective code rates of an ECC code used in the ECC engine.

12. A storage system comprising:
a host device; and
a data storage device comprising a non-volatile storage configured to store user data, firmware storing a second parity check matrix and a boot code, and a controller configured to control data exchange with the non-volatile storage,
wherein the controller comprises an error correction code (ECC) engine which stores a first parity check matrix, performs error correction on data exchanged with the non-volatile storage based on the first parity check matrix during a first operation mode, and performs error correction on data exchanged with the non-volatile storage based on the second parity check matrix extracted from the firmware during a second operation mode, and
wherein a code rate of the first parity check matrix and a code rate of the second parity check matrix are different.

13. The storage system of claim 12, wherein the first operation mode comprises an input and output mode for user data.

14. The storage system of claim 13, wherein the second operation mode is decided among operation modes excluding the first operation mode.

15. The storage system of claim 12, wherein the second operation mode comprises an update mode for the boot code.

16. The storage system of claim 12, wherein the firmware comprises a set of parity check matrix codes for respective code rates of an ECC code used in the ECC engine.

17. The storage system of claim 16, wherein the non-volatile storage stores firmware which is updated as any of the parity check matrix codes is changed or another parity check matrix is added.

18. A data storage device comprising:
a storage configured to store a boot code and firmware storing a second matrix; and
a controller including an error correction code (ECC) engine,
wherein the ECC engine is configured to:
perform an error correction operation on user data, which is to be written to, or read from, the non-volatile storage, based on a first matrix corresponding to a default code rate, and
perform an error correction operation on system data to update the boot code, when update of the boot code is to be performed, based on the second matrix extracted from the firmware, the second matrix corresponding to a code rate different from the default code rate,
wherein the firmware comprises a set of matrix codes for respective code rates of an ECC code used in the ECC engine.

* * * * *